United States Patent
Barnfield et al.

(10) Patent No.: US 9,495,496 B2
(45) Date of Patent: Nov. 15, 2016

(54) NON-INVASIVE INSERTION OF LOGIC FUNCTIONS INTO A REGISTER-TRANSFER LEVEL ('RTL') DESIGN

(71) Applicant: International Business Machines Corporation, Armonk, NY (US)

(72) Inventors: Stephen J. Barnfield, New York, NY (US); Ali S. El-Zein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 14/574,519

(22) Filed: Dec. 18, 2014

(65) Prior Publication Data

US 2016/0180000 A1    Jun. 23, 2016

(51) Int. Cl.
*G06F 17/50* (2006.01)

(52) U.S. Cl.
CPC .................. *G06F 17/5045* (2013.01)

(58) Field of Classification Search
CPC .................................... G06F 17/5081
USPC .................................. 716/101, 102
See application file for complete search history.

(56) References Cited

U.S. PATENT DOCUMENTS

| | | | | |
|---|---|---|---|---|
| 6,823,502 B2* | 11/2004 | Wingren | ............. | G06F 17/5045 716/102 |
| 7,251,794 B2* | 7/2007 | Blanco | ................ | G06F 17/5031 716/102 |
| 7,984,343 B2* | 7/2011 | Tamai | .............. | G01R 31/31707 714/25 |
| 8,549,448 B2* | 10/2013 | Vuillod | ............... | G06F 17/5022 716/104 |
| 2002/0188914 A1* | 12/2002 | Parashkevov | ....... | G06F 17/5022 716/103 |
| 2003/0079190 A1* | 4/2003 | Parashkevov | ....... | G06F 17/5022 716/103 |
| 2005/0138591 A1* | 6/2005 | Shirai | ................ | G06F 17/5081 716/111 |

* cited by examiner

*Primary Examiner* — Sun Lin
(74) *Attorney, Agent, or Firm* — Brandon C. Kennedy; Steven Meyers; Kennedy Lenart Spraggins LLP

(57) ABSTRACT

A method of non-invasive insertion of logic functions into a register-transfer level (RTL) design, including: selecting a logic function to insert into a RTL design; identifying each hierarchical level executing at least a portion of the logic function; identifying a highest hierarchical level amongst hierarchical levels having each hierarchical level executing at least a portion of the logic function; and inserting all connections necessary to execute the logic function into a hardware description representation of the highest hierarchical level, without modifying a hardware description representation of any other hierarchical levels.

18 Claims, 7 Drawing Sheets

NON-INVASIVE INSERTION OF LOGIC FUNCTIONS INTO A REGISTER-TRANSFER LEVEL ('RTL') DESIGN

BACKGROUND

The present disclosure is generally related to data processing, or, more specifically, methods, apparatus, and products for non-invasive insertion of logic functions into an RTL design.

DESCRIPTION OF RELATED ART

Modern circuits are frequently designed using automated design tools. During this process, a circuit designer can design all of a circuit or a portion of a circuit and depict such a circuit in an RTL design. Once designed, a designer may desire to insert testing functions, timing functions, or other logic functions. The insertion of such logic functions may cause unintended consequences as the insertion of such logic functions can cause a cascading series of changes that renders the design unreadable, even by the original designer. Furthermore, valuable processing resources are consumed updating potentially thousands of hardware language representations of the many hierarchical levels impacted by the insertion of such logic functions.

SUMMARY

Methods, apparatuses, and products for non-invasive insertion of logic functions into a RTL design, including: selecting a logic function to insert into an RTL design; identifying each hierarchical level executing at least a portion of the logic function; identifying a highest hierarchical level amongst each hierarchical level executing at least a portion of the logic function; and inserting all connections necessary to execute the logic function into a hardware description representation of the highest hierarchical level, without modifying a hardware description representation of any other hierarchical levels.

The foregoing and other objects, features and advantages described herein will be apparent from the following more particular descriptions of example embodiments as illustrated in the accompanying drawings wherein like reference numbers generally represent like parts of example embodiments.

DETAILED DESCRIPTION OF EXAMPLE EMBODIMENTS

Figure 1:
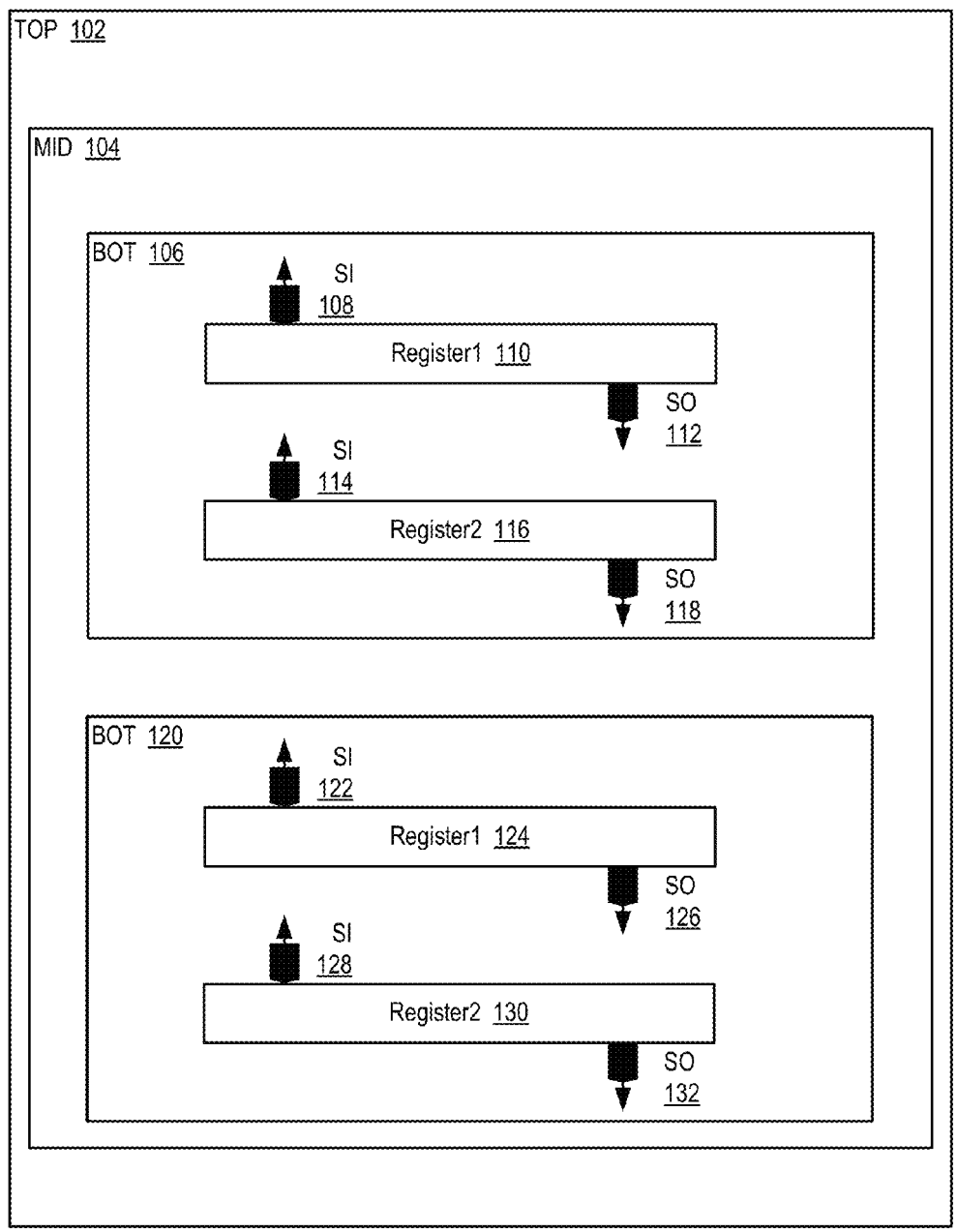
FIG. 1 sets forth a block diagram of an RTL design.

Example methods, apparatus, and products for non-invasive insertion of logic functions into a register-transfer level ('RTL') design are described according to embodiments described herein with reference to the accompanying drawings, beginning with FIG. 1. FIG. 1 sets forth a block diagram of an RTL design.

The RTL design depicted in FIG. 1 includes four hierarchical levels: TOP (102), MID (104), BOT (106), and BOT (120). The top hierarchical level, TOP (102), includes MID (104), BOT (106), and BOT (120) as hierarchical levels that are below TOP (102) and no levels that are above TOP (102). The middle hierarchical level, MID (104), includes BOT (106) and BOT (120) as hierarchical levels that are below MID (104) and TOP (102) as the level that is above MID (104). The bottom hierarchical levels, BOT (106) and BOT (120), are at the same level as each other and include no lower level, while levels TOP (102) and MID (104) are levels that are above BOT (106) and BOT (120).

The two bottom levels of the RTL design, BOT (106) and BOT (120), each include two registers (110, 116, 124, 130). Each register (110, 116, 124, 130) may be embodied, for example, as a flip-flop or latch. Each register (110, 116, 124, 130) is therefore a circuit that has two stable states and can be used to store state information. The state of each register (110, 116, 124, 130) can change through the use of signals applied to one or more control inputs and such registers (110, 116, 124, 130) can have one or two outputs from which the state of a particular register (110, 116, 124, 130) can be read. In the example depicted in FIG. 1, each register (110, 116, 124, 130) has an scan-in port identified as SI (108, 114, 122, 128) and a scan-out port identified as SO (112, 118, 126, 132) for participating in a scan chain logic function.

The example RTL design in FIG. 1 may be represented using a hardware description language such as VHSIC Hardware Description Language ('VHDL'), where "VHSIC" is an acronym for "Very High Speed Integrated Circuit." For example, each bottom level BOT (106) and BOT (120) could be represented by the following pseudo-code:

```
ENTITY BOT is
    port (clk: in bit;
    ...);
END entity BOT;
ARCHITECTURE RTL of BOT is
    signal si : bv (0 to 2);
    signal so : bv (0 to 2):
BEGIN
    Register1: entity LATCHES.DFF (DFF)
        port map (clk, ..., si (0), so (0));
    Register2: entity LATCHES.DFF (DFF)
        port map (clk, ..., si (1), so (1));
END architecture RTL;
```

Likewise, the middle level MID (104) could be represented by the following pseudo-code in an example where one instance of a bottom level, BOT (106), is referred to as inst_B1 and a second instance of a bottom level, BOT (120), is referred to as inst_B2:

```
ENTITY MID is
    port (clk: in bit;
    ...);
END entity MID;
ARCHITECTURE RTL of MID is
BEGIN
    inst_B1: entity WORK.BOT(RTL)
        port map (clk);
    inst_B2: entity WORK.BOT(RTL)
        port map (clk);
END architecture RTL;
```

Lastly, the top level TOP (102) could be represented by the following pseudo-code in an example where an instance of the middle level, MID (104), is referred to as inst_M1:

```
ENTITY TOP is
    port (clk: in bit;
    ...);
END entity TOP;
ARCHITECTURE RTL of TOP is
BEGIN
    inst_M1: entity WORK.MID(RTL)
        port map (clk => clk);
END architecture RTL;
```

Figure 2:
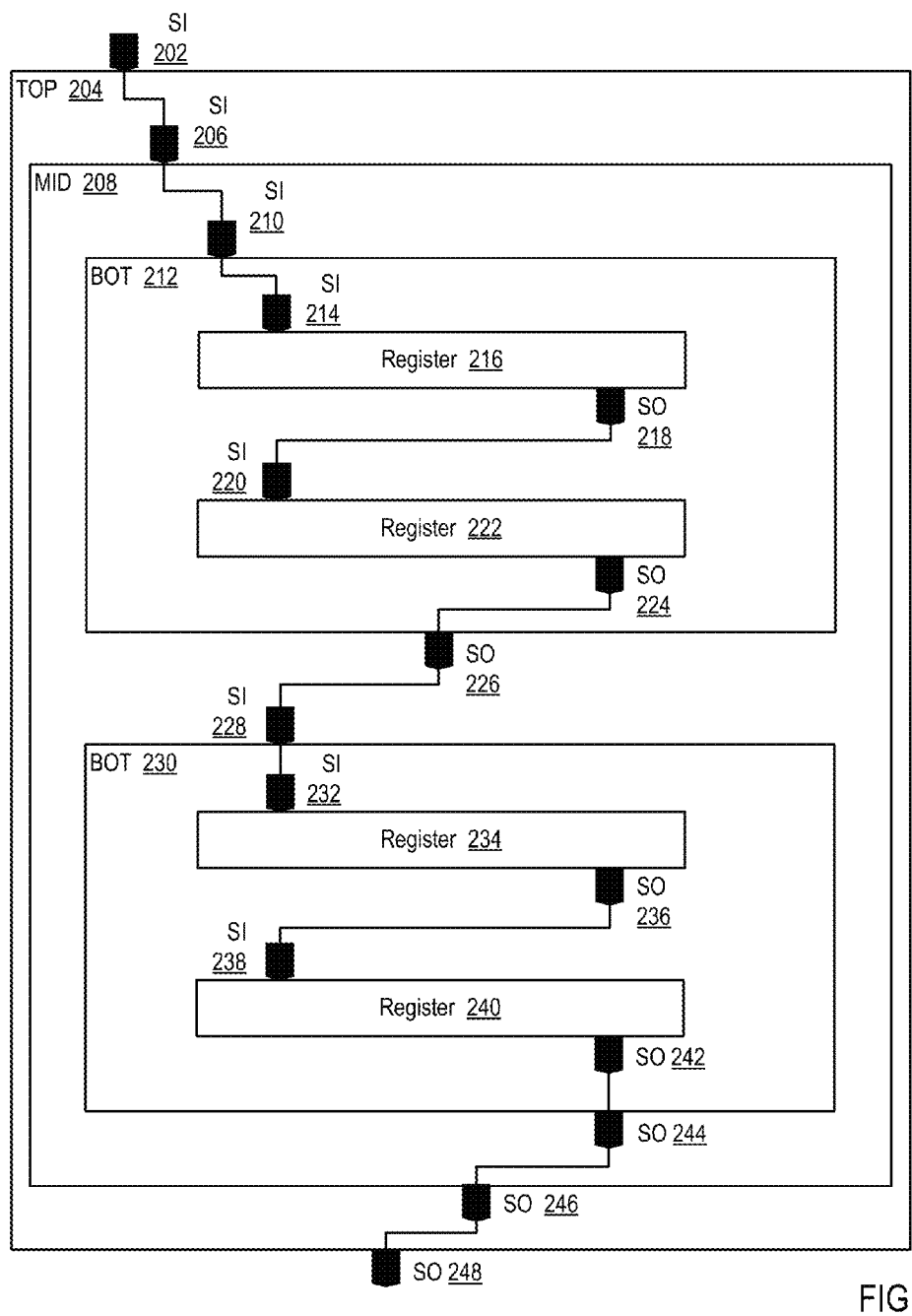
FIG. 2 sets forth a block diagram of an additional RTL design.

For further explanation, FIG. 2 sets forth a block diagram of an example RTL design. The RTL design of FIG. 2 is similar to the RTL design of FIG. 1. In the RTL design of FIG. 2, however, a logic function has been added to the RTL design without using hierarchical references. In particular, a scan chain insertion logic function has been added to the RTL design without using hierarchical references. A hierarchical reference, as the term is used here, represents a specification of a connection between components using the hierarchical names of the components.

Readers will appreciate that because hierarchical names cannot be used to specify connections between components, a relatively large number of scan-in ports SI (202), SI (206), SI (210), SI (214), SI (220), SI (228), SI (232), and SI (238) must be included in the circuit design. Likewise, a relatively large number of scan-out ports SO (218), SO (224), SO (226), SO (236), SO (242), SO (242), SO (244), SO (246), and SO (248) must be included in the circuit design. Readers will appreciate that the inclusion of a logic function in the RTL design without using hierarchical references causes the RTL design of FIG. 2 to become much more complicated than the RTL design of FIG. 1, in spite of the fact that the RTL design of FIG. 2 is similar to the RTL design depicted in FIG. 1, as the RTL design of FIG. 2 also includes two registers (216, 222) in a first bottom level BOT (212), two registers (234, 240) in a second bottom level BOT (230), a single middle level MID (208) that includes the two bottom levels BOT (212) and BOT (230), and a single top level TOP (204) that includes the middle level MID (208).

Readers will further appreciate that while the inclusion of a very simple logic function in a very simple circuit as is depicted in FIG. 2 can cause the circuit to significantly grow in complexity without using hierarchical references, the issue is exacerbated when more complex logic functions are added to a more complicated circuits without using hierarchical references. These added complexities will need to be propagated to the hardware description representations for each level and may therefore touch a large number of files, causing the design to become almost unrecognizable even to the original designer when a simple logic function is inserted into a design.

Figure 3:
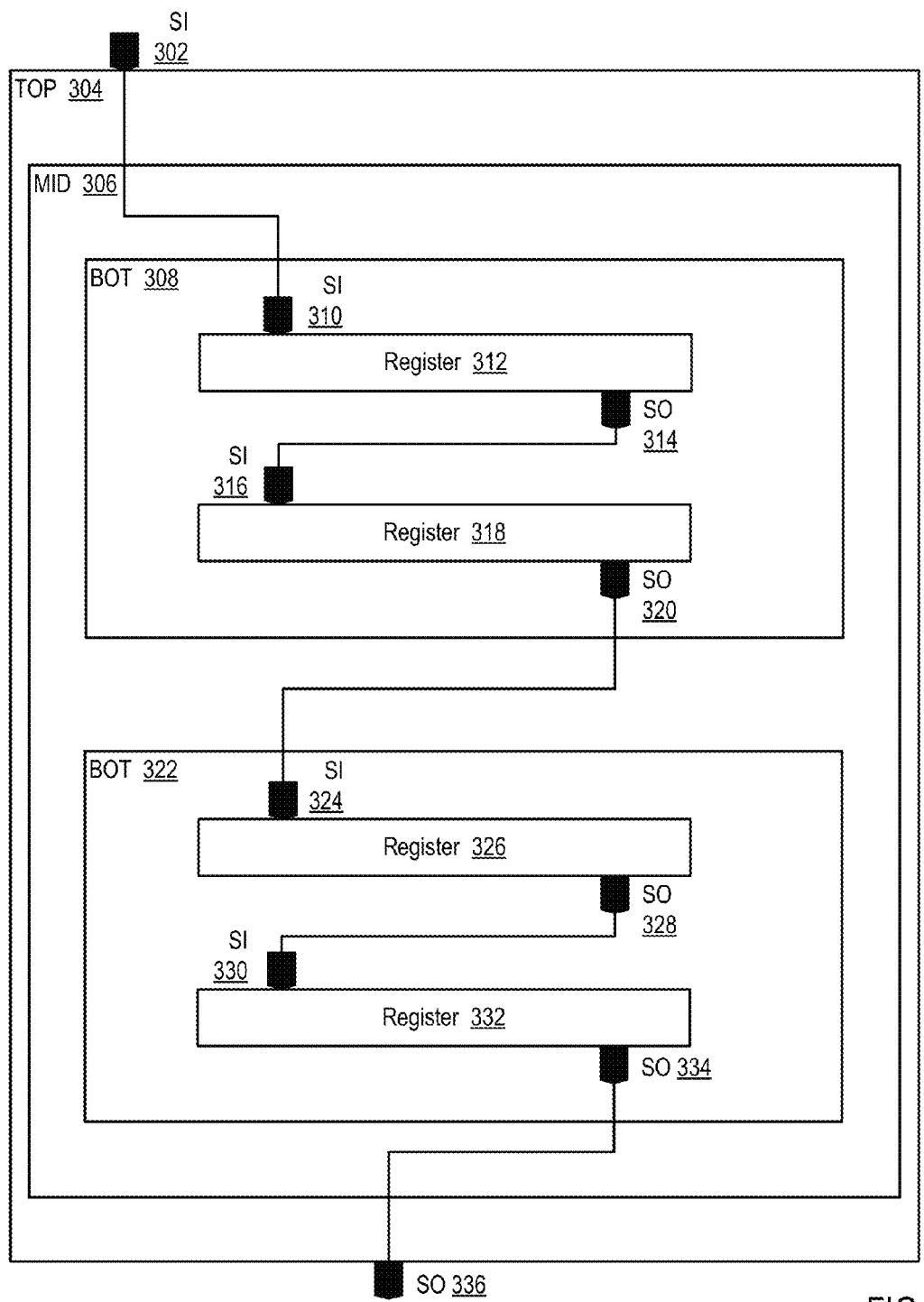
FIG. 3 sets forth a block diagram of an additional RTL design.

For further explanation, FIG. 3 sets forth a block diagram of an example RTL design. The RTL design of FIG. 3 is similar to the RTL design of FIG. 1, as the RTL design depicted in FIG. 3 also includes two registers (312, 318) in a first bottom level BOT (308), two registers (326, 332) in a second bottom level BOT (322), a single middle level MID (306) that includes the two bottom levels BOT (308) and BOT (322), and a single top level TOP (304) that includes the middle level MID (306). In the RTL design of FIG. 3, however, a logic function has been added to the RTL design using hierarchical references.

Readers will appreciate that because connections between components can be specified using hierarchical names, the need to insert intervening components to merely establish connections between hierarchical levels is reduced and a relatively small number of scan-in ports SI (302), SI (310), SI (316), SI (324), and SI (330) must be included in the circuit design as compared to the example depicted in FIG. 2. Likewise, a relatively small number of scan-out ports SO (314), SO (320), SO (328), SO (334), and SO (336) must be included in the circuit design as compared to the example depicted in FIG. 2.

In such an example, the top level, TOP (304), depicted in FIG. 3 could be represented by the following pseudo-code in an example where an instance of the middle level is referred to as inst_M1 and the two instances of the bottom levels are referred to as inst_B1 and inst_B2:

```
ENTITY TOP is
    port (clk, SI, SO : in bit;
    ...);
END entity TOP;
ARCHITECTURE RTL of TOP is
BEGIN
    inst_M1: entity WORK.MID(RTL)
        port map (clk => clk);
        <<signal inst_M1.inst_B1.si(0) : bit>> <=SI;
        <<signal inst_M1.inst_B1.si(1) : bit>> <= <<signal
            inst_M1.inst_b1.so(0)>>;
        <<signal inst_M1.inst_B2.si(0) : bit>> <= <<signal
            inst_M1.inst_b1.so(1)>>;
        <<signal inst_M1.inst_B2.si(1) : bit>> <= <<signal
            inst_M1.inst_b2.so(0)>>;
        SO <= <<signal inst_M1.inst_b2.so(1)>>;
END architecture RTL;
```

In such an example, all connections needed to carry out the execution of the scan-chain logic function can therefore be specified in the hardware description representation of TOP (304), without needing to update the hardware description representations of any of the other hierarchical levels. Readers will appreciate that each hardware description representation of a particular hierarchical level may be embodied, for example, as a VHDL representation, as a hardware description written in another language such as Verilog, or even as a hardware description written in System-Verilog, C, C++, System-C, or other appropriate language.

Readers will appreciate that adding the scan-chain logic function by using hierarchical references (with the resulting RTL design depicted in FIG. 3) has a benefit as opposed to adding a scan-chain logic function without using hierarchical references (with the resulting RTL design depicted in FIG. 2), as the increase in the complexity of the overall circuit design is minimized. Furthermore, many of the hardware description representations of levels in the RTL design will not need to be modified at all, or modified far less than would be necessitated by the addition of a logic function without using hierarchical references.

Readers will further appreciate that while the examples described herein refer specifically to logic functions such as a scan chain logic function designed to add testability features to a hardware product design, this example is only used for illustrative purposes and does not represent a limitation of the teachings contained herein. Readers will appreciate that many other types of logic functions may be non-invasively inserted into an RTL design in accordance with embodiments described herein.

Figure 4:
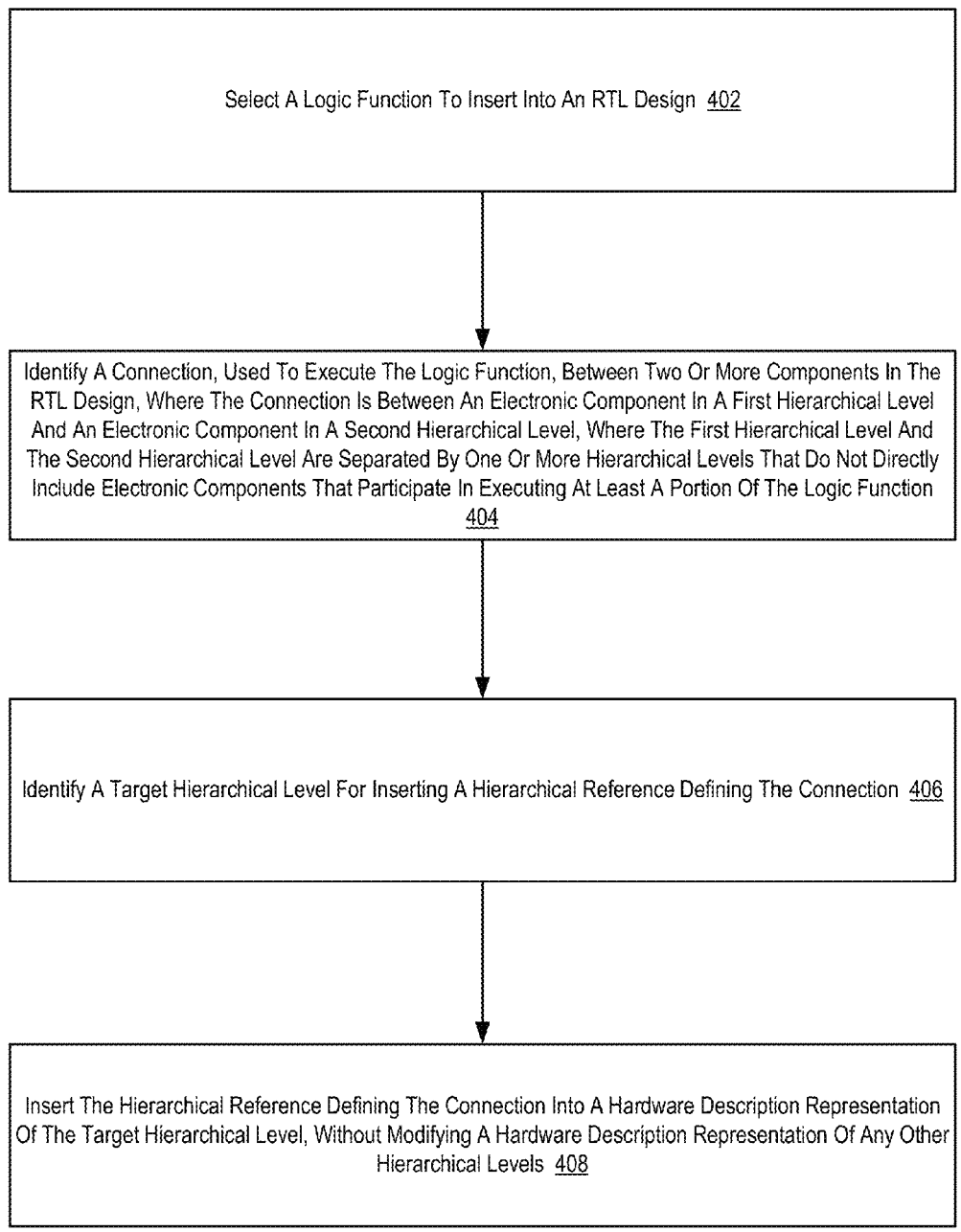
FIG. 4 sets forth a flow chart illustrating an example method for non-invasive insertion of logic functions into an RTL design according to embodiments described herein.

FIG. 4 sets forth a flow chart illustrating an example method for non-invasive insertion of logic functions into an RTL design according to embodiments described herein. The example method depicted in FIG. 4 includes selecting (402) a logic function to insert into an RTL design. The logic function of FIG. 4 may be embodied, for example, as a function that adds certain testability features to a hardware product design, as a function that adds certain clocking features to a hardware product design, and so on. In the example method depicted in FIG. 4, selecting (402) a logic function to insert into an RTL design may be carried out, for example, by selecting a particular logic function from a list of available logic functions that are presented to a circuit designer. Such a list of available logic functions may be presented to a circuit designer, for example, through the use of a textual menu that is presented via a circuit design tool, through the use of a graphical menu that is presented via a circuit design tool, and so on.

The example method depicted in FIG. 4 also includes identifying (404) a connection, used to execute the logic function, between two or more components in the RTL design. A connection used to execute the logic function may be embodied, for example, as a coupling between a port on a first component of the circuit design to a port on a second component of the circuit design, created so that the two components can exchange information. While many such connections may exist, in the example depicted in FIG. 4, at least one connection is between an electronic component in a first hierarchical level and an electronic component in a second hierarchical level, where the first hierarchical level and the second hierarchical level are separated by one or more hierarchical levels that do not directly include electronic components that participate in executing at least a portion of the logic function.

The example method depicted in FIG. 4 also includes identifying (406) a target hierarchical level for inserting a hierarchical reference defining the connection. The target hierarchical level for inserting a hierarchical reference defining the connection may be, for example, the top hierarchical level of the entire circuit design, a hierarchical level that is higher than any of the hierarchical names used in the hierarchical reference, a predesignated hierarchical level that includes all hierarchical references, and so on. As such, identifying (406) a target hierarchical level for inserting a hierarchical reference defining the connection may be carried out, for example, by identifying the top hierarchical level of the entire circuit design, by identifying each hierarchical level executing at least a portion of the logic function and identifying a highest hierarchical level amongst each hierarchical level executing at least a portion of the logic function, and so on.

The example method depicted in FIG. 4 also includes inserting (408) the hierarchical reference defining the connection into a hardware description representation of the target hierarchical level, without modifying a hardware description representation of any other hierarchical levels. In the example method depicted in FIG. 4, inserting (408) the hierarchical reference defining the connection into a hardware description representation of the target hierarchical level may be carried out by inserting such references between BEGIN and END statements in the hardware description representation of the target hierarchical level. Such a hierarchical reference may be generated automatically, by a circuit designer, and in other ways.

Figure 5:
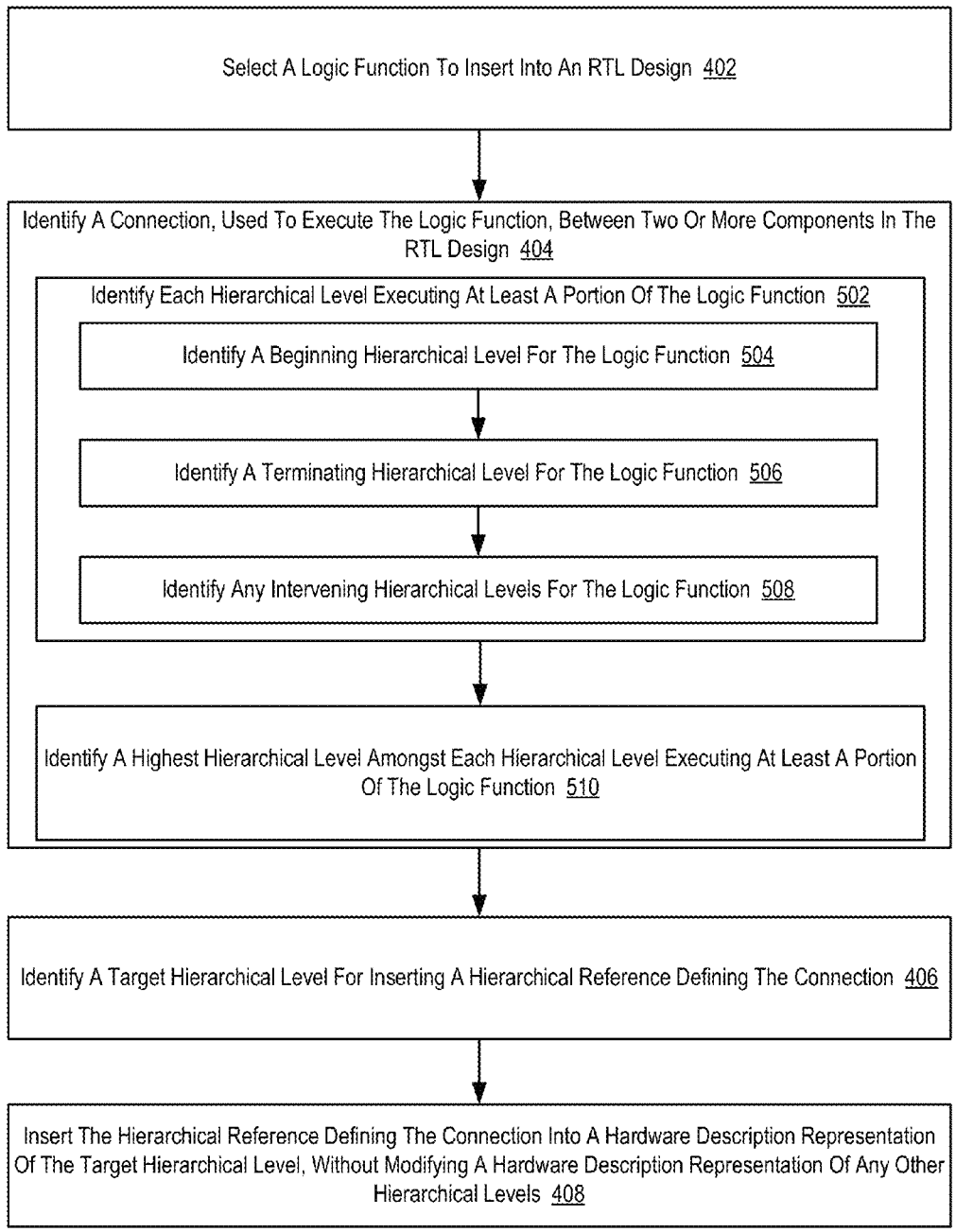
FIG. 5 sets forth a flow chart illustrating an additional example method for non-invasive insertion of logic functions into an RTL design according to embodiments described herein.

For further explanation, FIG. 5 sets forth a flow chart illustrating an additional example method for non-invasive insertion of logic functions into an RTL design according to embodiments described herein. The example method depicted in FIG. 5 is similar to the example method depicted in FIG. 4, as the example method depicted in FIG. 5 also includes selecting (402) a logic function to insert into an RTL design, identifying (404) a connection used to execute the logic function between two or more components in the RTL design, identifying (406) a target hierarchical level for inserting a hierarchical reference defining the connection, and inserting (408) the hierarchical reference defining the connection into a hardware description representation of the target hierarchical level, without modifying a hardware description representation of any other hierarchical levels.

In the example method depicted in FIG. 5, identifying (406) a target hierarchical level for inserting a hierarchical reference defining the connection can include identifying (502) each hierarchical level executing at least a portion of the logic function. In the example method depicted in FIG. 5, identifying (502) each hierarchical level executing at least a portion of the logic function may be carried out by receiving a name of each instance of a particular level that will be executing at least a portion of the logic function, by receiving a unique level identifier for a particular level that will be executing at least a portion of the logic function, and so on. In such an example, such information may be received via a textual selection box that is presented via a circuit design tool, through the use of a graphical selection interface that is presented via a circuit design tool, and in other ways.

In an alternative embodiment, the definition of a particular logic function may dictate which hierarchical level will be executing at least a portion of the logic function as certain logic functions may require the presence of certain components that may not be included in every hierarchical level. For example, in the RTL design depicted in FIG. 3, the middle hierarchical levels (MID (306) of FIG. 3) does not directly include any latches, and as such, the level that includes no latches that would not participate in a scan-chain logic function.

In a further alternative embodiment, one or more hierarchical levels may not participate in executing at least a portion of the logic function because a specific hierarchical level is not of interest for the purposes of a particular test. For example, if a designer were looking to test the timing performance of a small, critical section of a circuit design, timing structures may not be included in the hierarchical levels that are outside of the critical section of the circuit design.

In the example method depicted in FIG. 5, identifying (502) each hierarchical level executing at least a portion of the logic function can include identifying (504) a beginning hierarchical level for executing at least a portion of the logic function. In the example method depicted in FIG. 5, a beginning hierarchical level for the logic function can represent the first hierarchical level where execution of a particular logic function will begin. For example, in the RTL design depicted in FIG. 3, the top hierarchical level (TOP (304) of FIG. 3) would be the beginning hierarchical level. Identifying (504) a beginning hierarchical level for the logic function may be carried out, for example, by receiving a name of an instance of a particular level to be selected as the beginning hierarchical level, by receiving a unique level identifier for a particular level to be selected as the beginning hierarchical level, and so on. In such an example, such information may be received via a textual selection box that is presented via a circuit design tool, through the use of a graphical selection interface that is presented via a circuit design tool, and in other ways.

In the example method depicted in FIG. 5, identifying (502) each hierarchical level executing at least a portion of the logic function can also include identifying (506) a terminating hierarchical level for executing at least a portion of the logic function. In the example method depicted in FIG. 5, a terminating hierarchical level for the logic function can represent the last hierarchical level where execution of a particular logic function will end. For example, in the RTL design depicted in FIG. 3, the top hierarchical level (TOP (304) of FIG. 3) would be the terminating hierarchical level. Identifying (506) a terminating hierarchical level for the logic function may be carried out, for example, by receiving a name of an instance of a particular level to be selected as the terminating hierarchical level, by receiving a unique level identifier for a particular level to be selected as the terminating hierarchical level, and so on. In such an example, such information may be received via a textual selection box that is presented via a circuit design tool, through the use of a graphical selection interface that is presented via a circuit design tool, and in other ways.

In the example method depicted in FIG. 5, identifying (502) each hierarchical level executing at least a portion of the logic function can also include identifying (508) any intervening hierarchical levels for executing at least a portion of the logic function. In the example method depicted in FIG. 5, intervening hierarchical levels for the logic function can represent the hierarchical levels, if any exist, between the beginning hierarchical level and the terminating hierarchical level where execution of a particular logic function will continue on components that are directly included in a particular level itself—not including components that are indirectly included in a sublevel of the particular level itself. For example, in RTL design depicted in FIG. 3, the two bottom hierarchical levels (BOT (308) and BOT (322) of FIG. 3) would be the intervening hierarchical levels, while the middle hierarchical level (MID (306) of FIG. 3) would not be an intervening hierarchical level as the logic function is not executed using any components of the middle level. Identifying (508) any intervening hierarchical levels for the logic function may be carried out, for example, by receiving a name of an instance of a particular level to be selected as an intervening hierarchical level, by receiving a unique level identifier for a particular level to be selected as an intervening hierarchical level, and so on. In such an example, such information may be received via a textual selection box that is presented via a circuit design tool, through the use of a graphical selection interface that is presented via a circuit design tool, and in other ways.

In the example method depicted in FIG. 5, identifying (406) a target hierarchical level for inserting a hierarchical reference defining the connection can also include identifying (510) a highest hierarchical level amongst each hierarchical level executing at least a portion of the logic function. The highest hierarchical level amongst each hierarchical level executing at least a portion of the logic function represents the hierarchical level that is at the highest position in a hierarchy of levels. For example, in the RTL design depicted in FIG. 3, the top hierarchical level (TOP (304) of FIG. 3) would be the highest hierarchical level amongst each hierarchical level executing at least a portion of the logic function.

Figure 6:
FIG. 6 sets forth a flow chart illustrating an additional example method for non-invasive insertion of logic functions into an RTL design according to embodiments described herein.

For further explanation, FIG. 6 sets forth a flow chart illustrating an additional example method for non-invasive insertion of logic functions into an RTL design according to embodiments described herein. The example method depicted in FIG. 6 is similar to the example method depicted in FIG. 4, as the example method depicted in FIG. 6 also includes selecting (402) a logic function to insert into an RTL design, identifying (404) a connection used to execute the logic function between two or more components in the RTL design, identifying (406) a target hierarchical level for inserting a hierarchical reference defining the connection, and inserting (408) the hierarchical reference defining the connection into a hardware description representation of the target hierarchical level, without modifying a hardware description representation of any other hierarchical levels.

In the example method depicted in FIG. 6, identifying (406) a target hierarchical level for inserting a hierarchical reference defining the connection can include receiving (602) an identification of a predetermined target hierarchical level for inserting the hierarchical reference defining the connection. The predetermined target hierarchical level for inserting the hierarchical reference defining the connection may be embodied, for example, as a hierarchical level created or otherwise selected to contain hierarchical references defining the connection used to execute one or more logic functions. A predetermined target hierarchical level may exist, for example, for each designer, for each logic function, for each RTL design, or any combination thereof.

In the example method depicted in FIG. 6, inserting (408) the hierarchical reference defining the connection into a hardware description representation of the target hierarchical level can include inserting (604) a hierarchical reference that identifies a loop instance of electronic components generated using a loop. Consider the example circuit depicted in FIG. 3, where each bottom level BOT (106 of FIG. 3) and BOT (120 of FIG. 3) are represented by the following pseudo-code:

```
ENTITY BOT is
    port (clk: in bit;
    ...);
END entity BOT;
ARCHITECTURE RTL of BOT is
    signal si : bv (0 to 2);
    signal so : bv (0 to 2):
BEGIN
    GEN: FOR i IN 0 to 1 LOOP GENERATE
        signal si, so : bit;
    BEGIN
        Register: entity LATCHES.DFF (DFF)
            port map (clk, ..., si (i), so (i));
    END GENERATE GEN;
END architecture RTL;
```

In the example depicted above, the hardware description representation of the bottom level includes a loop for generating the two registers contained in each bottom level.

In such an example, inserting (604) a hierarchical reference that identifies a loop instance of electronic components generated using a loop may be carried out by structuring the hierarchical reference that is inserted into a target hierarchical level to refer to instances of the loop generated components. For example, the top level (TOP (304) of FIG. 3), could be represented by the following pseudo-code in an example where an instance of the middle level is referred to as inst_M1 and the two instances of the bottom levels are referred to as inst_B1 and inst_B2:

```
ENTITY TOP is
    port (clk, SI, SO : in bit;
        ...);
END entity TOP;
ARCHITECTURE RTL of TOP is
BEGIN
    inst_M1: entity WORK.MID(RTL)
    port map (clk => clk);
    <<signal inst_M1.inst_B1.GEN(0).si : bit>> <=SI;
    <<signal inst_M1.inst_B1.GEN(1).si : bit>> <= <<signal inst_M1.inst_b1.GEN(0).so>>;
    <<signal inst_M1.inst_B2.GEN(0).si : bit>> <= <<signal inst_M1.inst_b1.GEN(1).so>>;
    <<signal inst_M1.inst_B2.GEN(1).si : bit>> <= <<signal inst_M1.inst_b2.GEN(0).so>>;
    SO <= <<signal inst_M1.inst_b2.GEN(1).so>>;
END architecture RTL;
```

In the example depicted above, each scan-in port and scan-out port is identified by identifying which iteration of the loop generated the particular port. As such, each scan-in port and each scan-out port is referred to as an instance of a loop generated component.

The example method depicted in FIG. 6 also includes inserting (606) all connections necessary to execute the logic function into a hardware description representation of the target hierarchical level, without modifying a hardware description representation of any other hierarchical levels. In the example method depicted in FIG. 6, all connections necessary to execute the logic function into a hardware description representation of the target hierarchical level are inserted (606) into the target hierarchical level—not just those connections that span hierarchical levels. As such, the target hierarchical level can serve as a repository for each connection that is used to execute the logic function.

In the example method depicted in FIG. 6, inserting (606) all connections necessary to execute the logic function into a hardware description representation of the target hierarchical level can include inserting (608) a hierarchical reference that identifies a loop instance of electronic components generated using a loop. In the example method depicted in FIG. 6, inserting (608) a hierarchical reference that identifies a loop instance of electronic components generated using a loop may be carried out as described above and all connections necessary to execute the logic function may be identified using a hierarchical reference that identifies a loop instance of electronic components generated using a loop—not just those connections that span hierarchical levels.

Figure 7:
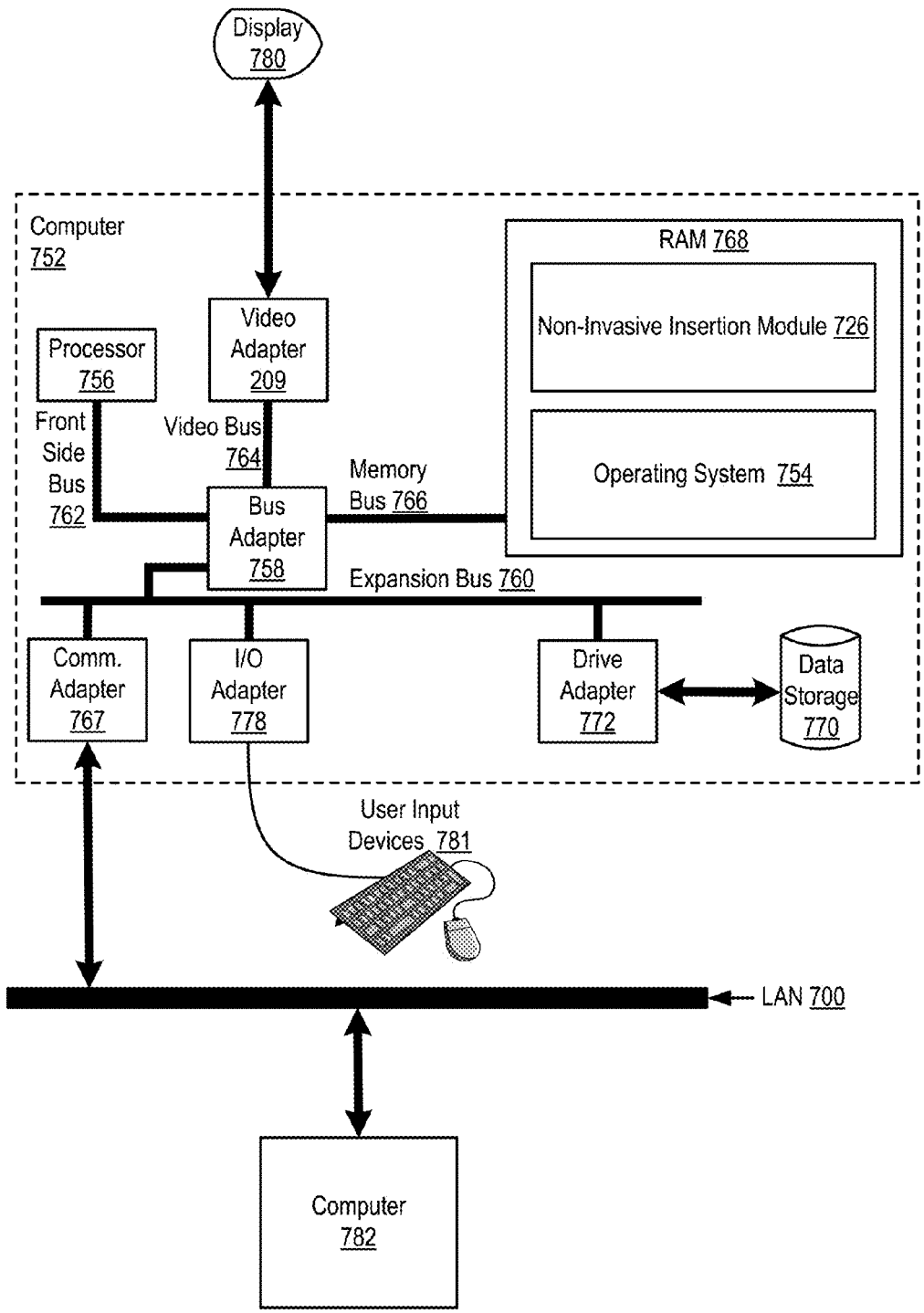
FIG. 7 sets forth a block diagram of automated computing machinery comprising an example computer useful in non-invasive insertion of logic functions into an RTL design according to embodiments described herein.

FIG. 7 sets forth a block diagram of automated computing machinery comprising an example computer (752) useful in non-invasive insertion of logic functions into an RTL design according to embodiments described herein. The computer (752) of FIG. 7 includes at least one computer processor (756) or 'CPU' as well as random access memory (768) ('RAM') which is connected through a high speed memory bus (766) and bus adapter (758) to processor (756) and to other components of the computer (752).

Stored in RAM (768) is a non-invasive insertion module (726), a module of computer program instructions for non-invasive insertion of logic functions into an RTL design. The non-invasive insertion module (726) may carry out non-invasive insertion of logic functions into an RTL design by selecting a logic function to insert into an RTL design; identifying a connection, used to execute the logic function, between two or more components in the RTL design, wherein the connection is between an electronic component in a first hierarchical level and an electronic component in a second hierarchical level, wherein the first hierarchical level and the second hierarchical level are separated by one or more hierarchical levels that do not directly include electronic components that participate in executing at least a portion of the logic function; identifying a target hierarchical level for inserting a hierarchical reference defining the connection; and inserting the hierarchical reference defining the connection into a hardware description representation of the target hierarchical level, without modifying a hardware description representation of any other hierarchical levels.

Also stored in RAM (768) is an operating system (754). Operating systems useful non-invasive insertion of logic functions into an RTL design according to embodiments described herein include UNIX™, Linux™, Microsoft XP™, AIX™, IBM's i5/OS™, and others as will occur to those of skill in the art. The operating system (754) and the non-invasive insertion module (726) in the example of FIG. 7 are shown in RAM (768), but many components of such software typically are stored in non-volatile memory also, such as, for example, on a disk drive (770).

The computer (752) of FIG. 7 includes disk drive adapter (772) coupled through expansion bus (760) and bus adapter (758) to processor (756) and other components of the computer (752). Disk drive adapter (772) connects non-volatile data storage to the computer (752) in the form of disk drive (770). Disk drive adapters useful in computers for non-invasive insertion of logic functions into an RTL design according to embodiments described herein include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (752) of FIG. 7 includes one or more input/output ('I/O') adapters (778). I/O adapters implement user-oriented input/output through, for example, software drivers and computer hardware for controlling output to display devices such as computer display screens, as well as user input from user input devices (781) such as keyboards and mice. The example computer (752) of FIG. 7 includes a video adapter (209), which is an example of an I/O adapter specially designed for graphic output to a display device (780) such as a display screen or computer monitor. Video adapter (209) is connected to processor (756) through a high speed video bus (764), bus adapter (758), and the front side bus (762), which is also a high speed bus.

The example computer (752) of FIG. 7 includes a communications adapter (767) for data communications with other computers (782) and for data communications with a data communications network (700). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for non-invasive insertion of logic functions into an RTL design according to embodiments described herein include modems for wired dial-up communications, Ethernet (IEEE 802.3) adapters for wired data communications network communications, and 802.11 adapters for wireless data communications network communications.

Embodiments described herein may be a system, a method, and/or a computer program product. The computer program product may include a computer readable storage medium (or media) having computer readable program instructions thereon for causing a processor to carry out aspects described herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects described herein.

Aspects of various embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments described herein. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments without departing from its true spirit. The descriptions in this specification are for purposes of illustration only and are not to be construed in a limiting sense. The scope of the present disclosure is limited only by the language of the following claims.

What is claimed is:

1. A method of non-invasive insertion of logic functions into a register-transfer level ('RTL') design, the method comprising:
   selecting, by computer program instructions executing on a computer processor, a logic function to insert into an RTL design;
   identifying, by computer program instructions executing on the computer processor, a connection, used to execute the logic function, between two or more components in the RTL design, wherein the connection is between another electronic component in a first hierarchical level and an electronic component in a second hierarchical level, wherein the first hierarchical level and the second hierarchical level are separated by one or more hierarchical levels that do not directly include electronic components that participate in executing at least a portion of the logic function;
   identifying, by computer program instructions executing on the computer processor, a target hierarchical level for inserting a hierarchical reference defining the connection; and
   inserting, by computer program instructions executing on the computer processor, the hierarchical reference defining the connection into a hardware description representation of the target hierarchical level, without modifying a hardware description representation of any other hierarchical levels.

2. The method of claim 1 wherein the identifying, by computer program instructions executing on the computer processor, a target hierarchical level for inserting a hierarchical reference defining the connection further comprises:
   identifying each hierarchical level executing at least a portion of the logic function; and
   identifying a highest hierarchical level amongst hierarchical levels having each hierarchical level executing at least a portion of the logic function.

3. The method of claim 2 wherein the identifying, by computer program instructions executing on the computer processor, each hierarchical level executing at least a portion of the logic function further comprises:
   identifying a beginning hierarchical level for executing at least a portion of the logic function;
   identifying a terminating hierarchical level for executing at least a portion of the logic function; and
   identifying any intervening hierarchical levels for executing at least a portion of the logic function.

4. The method of claim 1 wherein the identifying, by computer program instructions executing on the computer processor, the target hierarchical level for inserting a hierarchical reference defining the connection further comprises receiving an identification of a predetermined target hierarchical level for inserting the hierarchical reference defining the connection.

5. The method of claim 1 wherein the inserting, by computer program instructions executing on the computer processor, the hierarchical reference defining the connection into a hardware description representation of the target hierarchical level further comprises inserting a hierarchical reference that identifies a loop instance of electronic components generated using a loop.

6. The method of claim 1 further comprising inserting, by computer program instructions executing on the computer processor, all connections necessary to execute the logic function into the hardware description representation of the target hierarchical level, without modifying the hardware description representation of any other hierarchical levels.

7. An apparatus for non-invasive insertion of logic functions into a register-transfer level ('RTL') design, the apparatus comprising a computer processor, a computer memory operatively coupled to the computer processor, the computer memory having disposed within it computer program instructions that, when executed by the computer processor, cause the apparatus to carry out steps of:
   selecting a logic function to insert into an RTL design;
   identifying a connection, used to execute the logic function, between two or more components in the RTL design, wherein the connection is between another electronic component in a first hierarchical level and an electronic component in a second hierarchical level, wherein the first hierarchical level and the second hierarchical level are separated by one or more hierarchical levels that do not directly include electronic components that participate in executing at least a portion of the logic function;
   identifying a target hierarchical level for inserting a hierarchical reference defining the connection; and
   inserting the hierarchical reference defining the connection into a hardware description representation of the target hierarchical level, without modifying a hardware description representation of any other hierarchical levels.

8. The apparatus of claim 7 wherein the identifying a target hierarchical level for inserting a hierarchical reference defining the connection further comprises:
   identifying each hierarchical level executing at least a portion of the logic function; and
   identifying a highest hierarchical level amongst hierarchical levels having each hierarchical level executing at least a portion of the logic function.

9. The apparatus of claim 8 wherein the identifying each hierarchical level executing at least a portion of the logic function further comprises:
   identifying a beginning hierarchical level for executing at least a portion of the logic function;
   identifying a terminating hierarchical level for executing at least a portion of the logic function; and
   identifying any intervening hierarchical levels for executing at least a portion of the logic function.

10. The apparatus of claim 7 wherein the identifying the target hierarchical level for inserting a hierarchical reference defining the connection further comprises receiving an identification of a predetermined target hierarchical level for inserting the hierarchical reference defining the connection.

11. The apparatus of claim 7 wherein the inserting the hierarchical reference defining the connection into a hardware description representation of the target hierarchical level further comprises inserting a hierarchical reference that identifies a loop instance of electronic components generated using a loop.

12. The apparatus of claim 7 further comprising computer program instructions that, when executed by the computer processor, cause the apparatus to carry out a step of inserting all connections necessary to execute the logic function into the hardware description representation of the target hierarchical level, without modifying the hardware description representation of any other hierarchical levels.

13. A computer program product for non-invasive insertion of logic functions into a register-transfer level ('RTL') design, the computer program product disposed upon a non-transitory computer readable storage device, the computer program product comprising computer program instructions that, when executed by a computer, cause the computer to carry out steps of:

selecting a logic function to insert into an RTL design;

identifying a connection, used to execute the logic function, between two or more components in the RTL design, wherein the connection is between another electronic component in a first hierarchical level and an electronic component in a second hierarchical level, wherein the first hierarchical level and the second hierarchical level are separated by one or more hierarchical levels that do not directly include electronic components that participate in executing at least a portion of the logic function;

identifying a target hierarchical level for inserting a hierarchical reference defining the connection; and inserting the hierarchical reference defining the connection into a hardware description representation of the target hierarchical level, without modifying a hardware description representation of any other hierarchical levels.

14. The computer program product of claim 13 wherein the identifying a target hierarchical level for inserting a hierarchical reference defining the connection further comprises:

identifying each hierarchical level executing at least a portion of the logic function; and identifying a highest hierarchical level amongst hierarchical levels having each hierarchical level executing at least a portion of the logic function.

15. The computer program product of claim 14 wherein the identifying each hierarchical level executing at least a portion of the logic function further comprises:

identifying a beginning hierarchical level for executing at least a portion of the logic function;

identifying a terminating hierarchical level for executing at least a portion of the logic function; and identifying any intervening hierarchical levels for executing at least a portion of the logic function.

16. The computer program product of claim 13 wherein the identifying a target hierarchical level for inserting a hierarchical reference defining the connection further comprises receiving an identification of a predetermined target hierarchical level for inserting the hierarchical reference defining the connection.

17. The computer program product of claim 13 wherein the inserting the hierarchical reference defining the connection into a hardware description representation of the target hierarchical level further comprises inserting a hierarchical reference that identifies a loop instance of electronic components generated using a loop.

18. The computer program product of claim 13 further comprising computer program instructions that, when executed by the computer, cause the computer to carry out a step of inserting all connections necessary to execute the logic function into the hardware description representation of the target hierarchical level, without modifying the hardware description representation of any other hierarchical levels.

* * * * *